(12) United States Patent
Amano et al.

(10) Patent No.: US 10,730,448 B2
(45) Date of Patent: Aug. 4, 2020

(54) VEHICLE DISPLAY DEVICE AND VEHICLE

(71) Applicant: Toyota Jidosha Kabushiki Kaisha, Toyota-shi Aichi-ken (JP)

(72) Inventors: Megumi Amano, Toyota (JP); Kohei Maejima, Nagakute (JP); Chika Kajikawa, Toyota (JP); Hikaru Gotoh, Nagoya (JP); Yoshiaki Matsumura, Toyota (JP); Chiharu Hayashi, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 56 days.

(21) Appl. No.: 16/229,749

(22) Filed: Dec. 21, 2018

(65) Prior Publication Data

US 2019/0193644 A1 Jun. 27, 2019

(30) Foreign Application Priority Data

Dec. 27, 2017 (JP) .................... 2017-251750

(51) Int. Cl.
*B60R 11/02* (2006.01)
*H05K 5/02* (2006.01)
*H05K 5/00* (2006.01)
*G09G 5/38* (2006.01)
*B60R 11/00* (2006.01)
*G05D 1/02* (2020.01)

(52) U.S. Cl.
CPC ........ *B60R 11/0235* (2013.01); *H05K 5/0017* (2013.01); *H05K 5/0217* (2013.01); *B60R 2011/0005* (2013.01); *B60R 2011/0045* (2013.01); *B60R 2011/0084* (2013.01); *B60R 2011/0085* (2013.01); *G05D 1/021* (2013.01); *G05D 2201/0213* (2013.01); *G09G 5/38* (2013.01); *G09G 2340/0492* (2013.01)

(58) Field of Classification Search
CPC ........ B60R 11/0235; B60R 2011/0045; B60R 2011/0084; B60R 2011/0005; B60R 2011/0085; B60R 2011/008; H05K 5/0017; H05K 5/0217; G09G 2340/0492; G09G 5/38; G09G 2380/10; G05D 2201/0213; G05D 1/021; G06F 3/147
USPC ........................................... 296/70
See application file for complete search history.

(56) References Cited

U.S. PATENT DOCUMENTS 8,649,161 B2* 2/2014 Kato ............... B60R 11/0235
361/679.01
9,688,146 B2* 6/2017 Kim .................. B60K 35/00
9,989,761 B2* 6/2018 Yomogita ........... F16M 13/022
2019/0255945 A1* 8/2019 Yamazaki ............ B60R 11/02

FOREIGN PATENT DOCUMENTS

JP 2016-196228 A 11/2016

* cited by examiner

*Primary Examiner* — Pinel E Romain
(74) *Attorney, Agent, or Firm* — Dinsmore & Shohl LLP

(57) ABSTRACT

A vehicle display device includes a display and a moving device. The display is formed in an elongate shape. The moving device moves the display between a lower position at a vehicle width direction central portion of an instrument panel of a vehicle, and an upper position at a vehicle upper side of the lower position. In the lower position the moving device orients the longitudinal direction of the display along a vehicle vertical direction. In the upper position the moving device orients the longitudinal direction of the display along a vehicle width direction.

14 Claims, 9 Drawing Sheets

VEHICLE DISPLAY DEVICE AND VEHICLE

CROSS-REFERENCE TO RELATED APPLICATION

This application is based on and claims priority under 35 USC 119 from Japanese Patent Application No. 2017-251750 filed on Dec. 27, 2017, the disclosure of which is incorporated by reference herein.

BACKGROUND

Technical Field

The present disclosure relates to a vehicle display device installed in a vehicle and a vehicle equipped with the vehicle display device.

Related Art

Japanese Patent Application Laid-open (JP-A) No. 2016-196228 discloses a display system that is equipped with a display and installed in an automobile. The display system is configured in such a way that, when the automobile is driving autonomously, the display is moved in front of the driver and, when the automobile is being manually driven, the display is moved to a position in which it does not obstruct the forward field of view of the driver. As an example of this display system, JP-A No. 2016-196228 discloses a display system which, when the automobile is driving autonomously, displays a screen on a horizontally long front display provided in front of the driver and, when the automobile is being manually driven, displays a screen on a horizontally long in-dash display (center display) provided in a vehicle width direction central portion of an instrument panel.

In the related art described above, when the display is moved in front of the driver, it becomes difficult for occupants in the front passenger seat and rear seats to view the display. Furthermore, center displays have been increasing in size in recent years, but there are cases where it is difficult to ensure space for placing a large and horizontally long center display in the vehicle width direction center of the instrument panel.

SUMMARY

In consideration of the circumstances described above, it is an object of the present disclosure to obtain a vehicle display device and a vehicle with which it becomes easier to ensure placement space for a large display in a vehicle width direction central portion of an instrument panel of a vehicle and which can make it easier not only for a driver but also occupants in a front passenger seat and rear seats to view the display.

A vehicle display device of a first aspect of the disclosure includes a display and a moving device. The display is formed in an elongate shape. The moving device moves the display between a lower position at a vehicle width direction central portion of an instrument panel of a vehicle, and an upper position at a vehicle upper side of the lower position. In the lower position the moving device orients a longitudinal direction of the display along a vehicle vertical direction. In the upper position the moving device orients the longitudinal direction of the display along the vehicle width direction.

According to the vehicle display device of the first aspect of the disclosure, the moving device moves the long display between the lower position set in the vehicle width direction central portion of the instrument panel of the vehicle and the upper position at the vehicle upper side of the lower position. In the lower position the longitudinal direction of the display is oriented along the vehicle vertical direction, so even in a case where the display is large, it becomes easier to ensure placement space for the display in the vehicle width direction central portion of the instrument panel. Furthermore, in the upper position the longitudinal direction of the display is oriented along the vehicle width direction, so the horizontally long screen of a TV program or the Internet, for example, can be displayed large on the display. Moreover, the display is moved in the vehicle upward direction at the vehicle width direction central portion of the vehicle, so it becomes easier not only for the driver but also occupants in the front passenger seat and rear seats to view the display. It will be noted that when the vehicle is manually driven, it is useful that the upward moving of the display by the moving device be regulated or limited to ensure that the forward field of view of the driver is not reduced by the display. The same also holds true in a second aspect of the disclosure.

A vehicle display device of a second aspect of the disclosure includes a display and a moving device. The display is formed in an elongate shape. The moving device moves the display between a lower position at a vehicle width direction central portion of an instrument panel of a vehicle, and an upper position at a the vehicle upper side of the lower position. In the lower position the moving device orients a longitudinal direction of the display along a vehicle vertical direction. In the upper position the longitudinal direction of the display is selectively switchable between a state in which the longitudinal direction is oriented along the vehicle vertical direction and a state in which the longitudinal direction is oriented along the vehicle width direction.

According to the vehicle display device of the second aspect of the disclosure, the moving device moves the display between the lower position set in the vehicle width direction central portion of the instrument panel of the vehicle, and the upper position at the vehicle upper side of the lower position. In the lower position the longitudinal direction of the display is oriented along the vehicle vertical direction, so even in a case where the display is large, it becomes easier to ensure placement space for the display in the vehicle width direction central portion of the instrument panel. Furthermore, in the upper position the longitudinal direction of the display is selectively switchable between a state in which the longitudinal direction is oriented along the vehicle vertical direction and a state in which the longitudinal direction is oriented along the vehicle width direction. For this reason, for example, when an occupant of the vehicle wants to display on the display the horizontally long screen of a TV program or the Internet, the horizontally long screen can be displayed large on the display by switching the display to the state in which the longitudinal direction of the display is oriented along the vehicle width direction. Moreover, the display is moved in the vehicle upward direction at the vehicle width direction central portion of the vehicle, so it becomes easier not only for the driver but also occupants in the front passenger seat and rear seats to view the display.

A vehicle display device of a third aspect of the disclosure is the vehicle display device of the first or second aspect, wherein the vehicle is switchable between manual driving and autonomous driving. Furthermore, the moving device disposes the display in the lower position when the vehicle is being manually driven and allows movement of the display when the vehicle is driving autonomously and when the vehicle is not being driven.

According to the vehicle display device of the third aspect of the disclosure, the moving device disposes the display in the lower position when the vehicle is being manually driven. Because of this, the field of view of the driver can be prevented from being reduced by the display. Furthermore, when the vehicle is driving autonomously and when the vehicle is not being driven (e.g., when there is an occupant inside the vehicle when the vehicle is parked), the moving device allows movement of the display between the lower position and the upper position. Because of this, the occupant can arbitrarily move the display to the upper position using the moving device.

A vehicle display device of a fourth aspect of the disclosure is the vehicle display device of the first or second aspects, wherein the moving device comprises a forward movement allowance mechanism. In a case in which a load equal to or greater than a preset value has acted from a vehicle rear side, on the display positioned in the upper position, the forward movement allowance mechanism allows relative movement of the display in a vehicle forward direction with respect to the instrument panel.

In the vehicle display device of the fourth aspect of the disclosure, in a case in which a load equal to or greater than the preset value has acted from the vehicle rear side on the display positioned in the upper position, the forward movement allowance mechanism that the moving device comprises allows relative movement of the display in the vehicle forward direction with respect to the instrument panel. Because of this, even if an occupant should hit the display positioned in the upper position, the load that the occupant receives is lessened.

A vehicle pertaining to a fifth aspect of the disclosure includes an instrument panel in which the vehicle display device according to the first or second aspects is installed.

In the vehicle of the fifth aspect of the disclosure, the vehicle display device of the first or second aspects is installed in the instrument panel, so the aforementioned action and effects are achieved.

As described above, in the vehicle display device and the vehicle pertaining to the disclosure, it becomes easier to ensure placement space for a large display in a vehicle width direction central portion of an instrument panel of a vehicle, and it can be made easier not only for a driver but also occupants in a front passenger seat and rear seats to view the display.

BRIEF DESCRIPTION OF THE DRAWINGS

Exemplary embodiments of the disclosure will be described in detail based on the following figures, wherein.

DETAILED DESCRIPTION

First Embodiment

Figure 1:
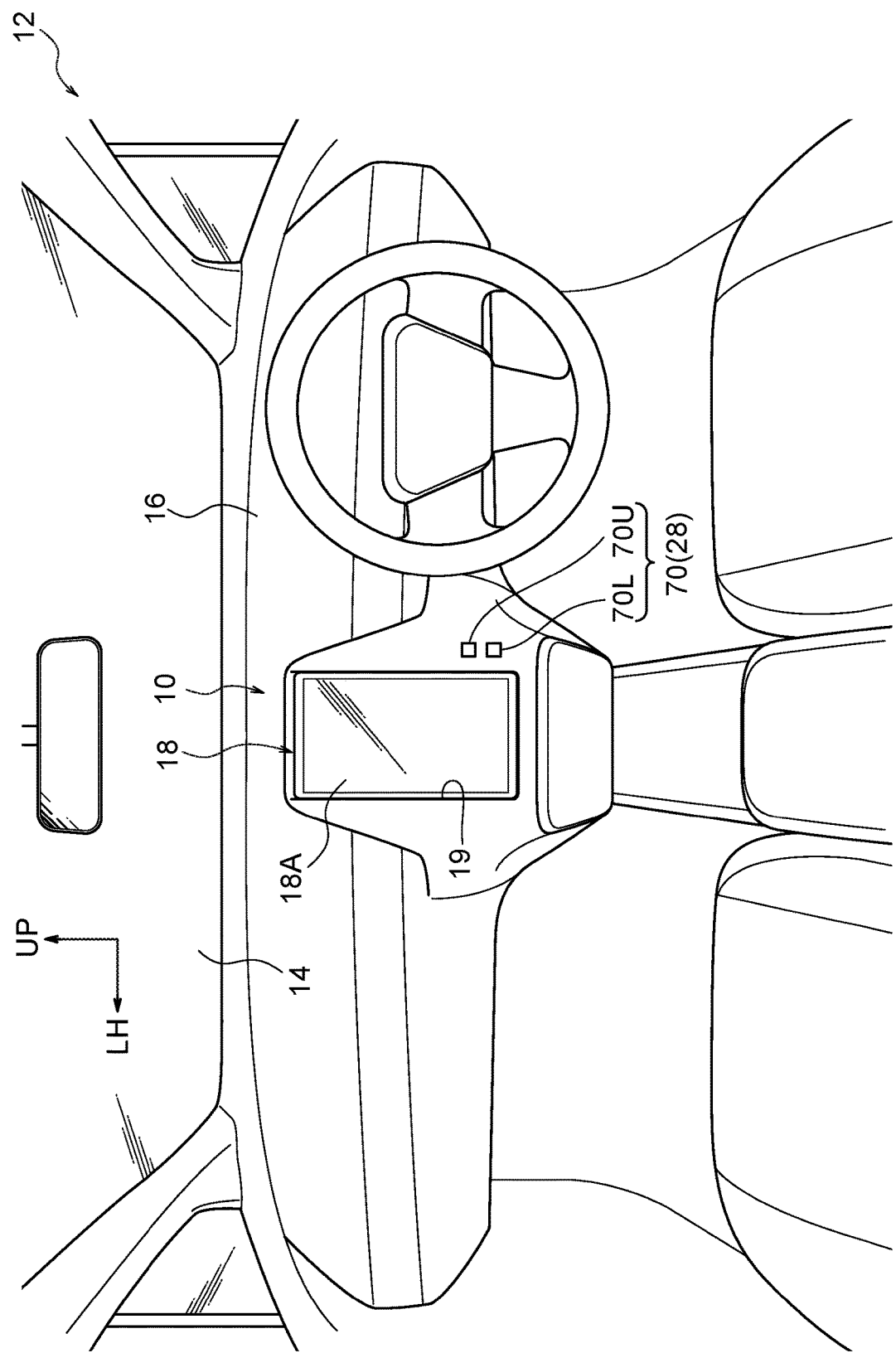
FIG. 1 is a perspective view showing the front portion of a cabin of a vehicle in which a vehicle display device pertaining to a first embodiment of the disclosure is installed, and shows a state in which a display is positioned in a lower position.

A vehicle display device 10 and a vehicle 12 pertaining to a first embodiment of the disclosure will be described below using FIG. 1 to FIG. 8. It will be noted that arrow FR, arrow UP, and arrow LH appropriately shown in the drawings indicate a forward direction (traveling direction), an upward direction, and a leftward direction of the vehicle 12. Below, when description is given simply using the directions of front/rear, right/left, and upper/lower, unless otherwise specified these will be understood to mean front/rear in the vehicle front and rear direction, right/left in the vehicle right and left direction (vehicle width direction), and upper/lower in the vehicle vertical direction. Furthermore, in the drawings there are cases where some reference signs are omitted to make it easier to see what is shown in the drawings.

(Configuration)

Figure 2:
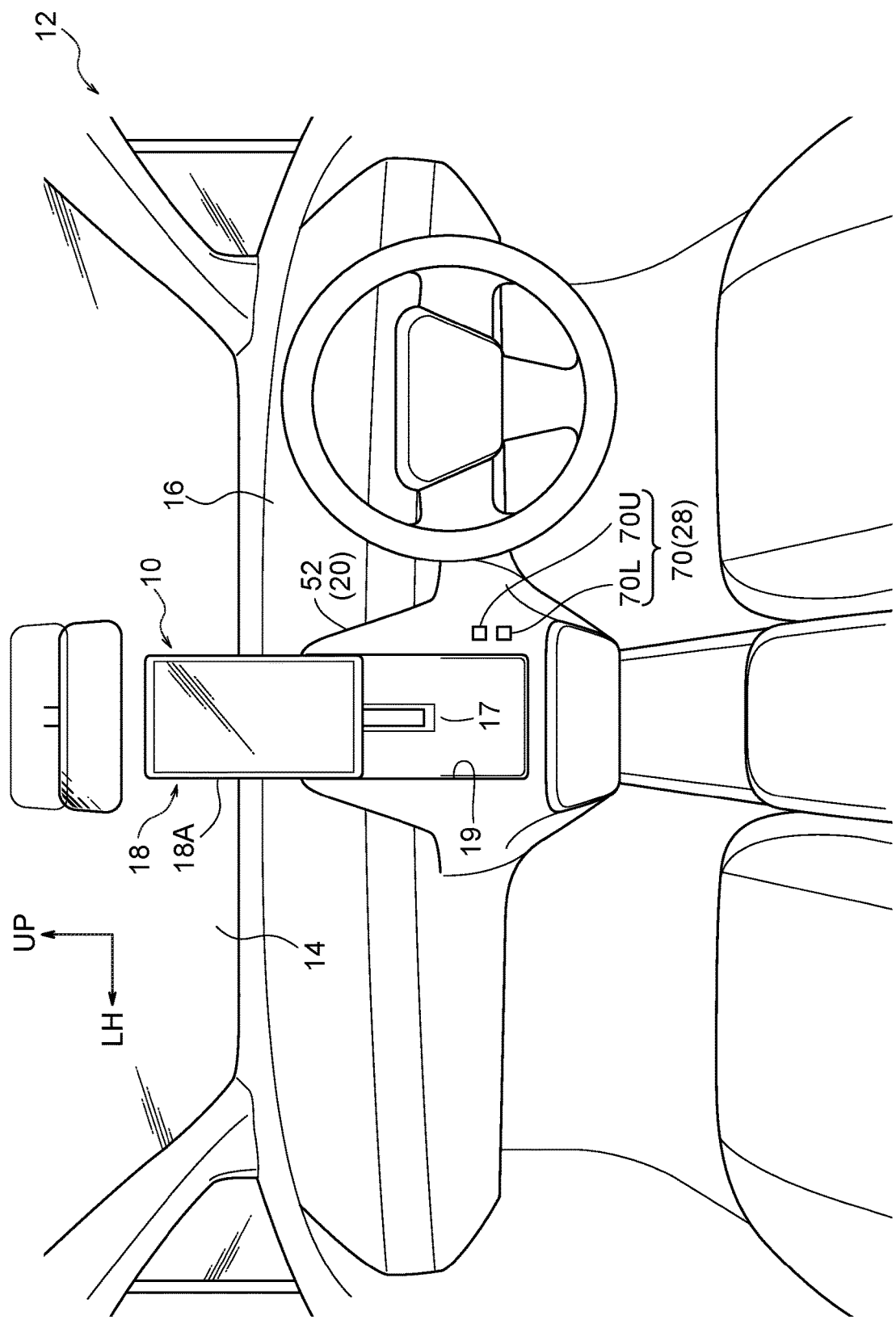
FIG. 2 is a perspective view, corresponding to FIG. 1, showing a state in which the display is positioned in an upper position with its longitudinal direction oriented along the vehicle vertical direction.
Figure 3:
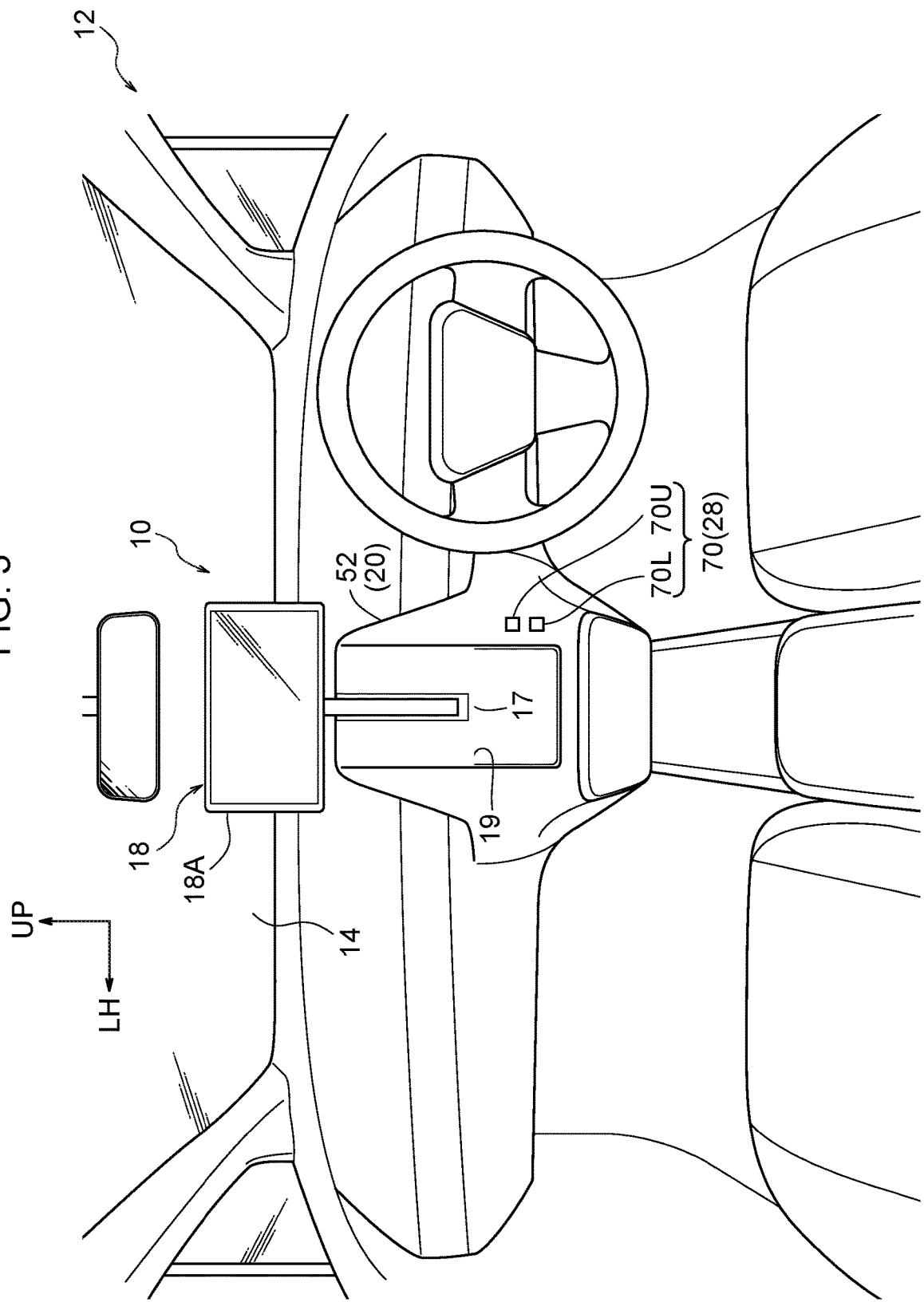
FIG. 3 is a perspective view, corresponding to FIG. 1, showing a state in which the display is positioned in the upper position with its longitudinal direction oriented along the vehicle width direction.

The vehicle 12 pertaining to the present embodiment is an automobile that is switchable between autonomous driving and manual driving. In the vehicle 12, as shown in FIG. 1 to FIG. 3, an instrument panel 16 is provided under a windshield glass 14 in the front portion of the cabin. The vehicle display device 10 pertaining to the present embodiment is installed in the vehicle width direction central portion of the instrument panel 16.

Figure 4:
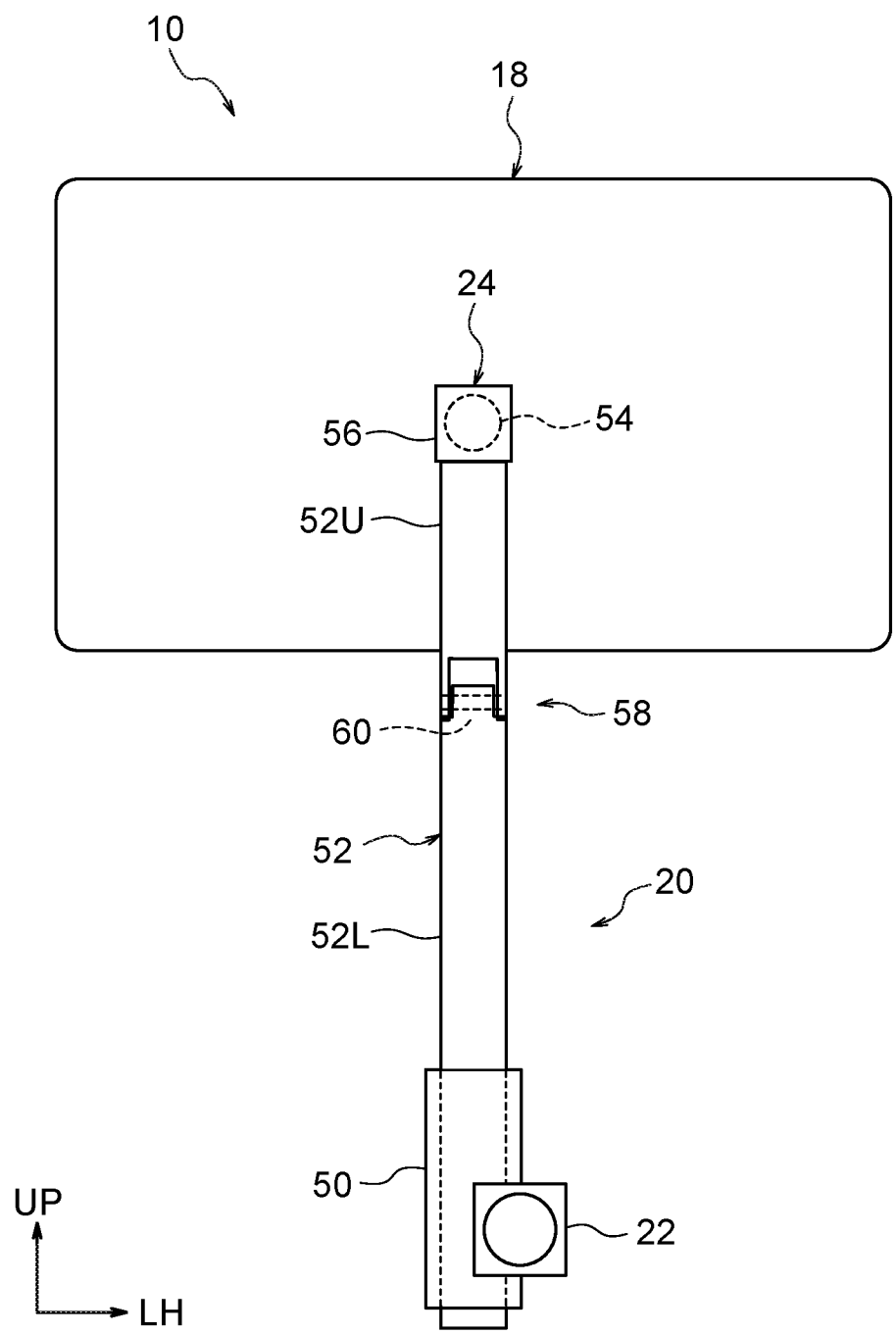
FIG. 4 is a back view of the display and a moving device as seen from the vehicle front side.
Figure 5:
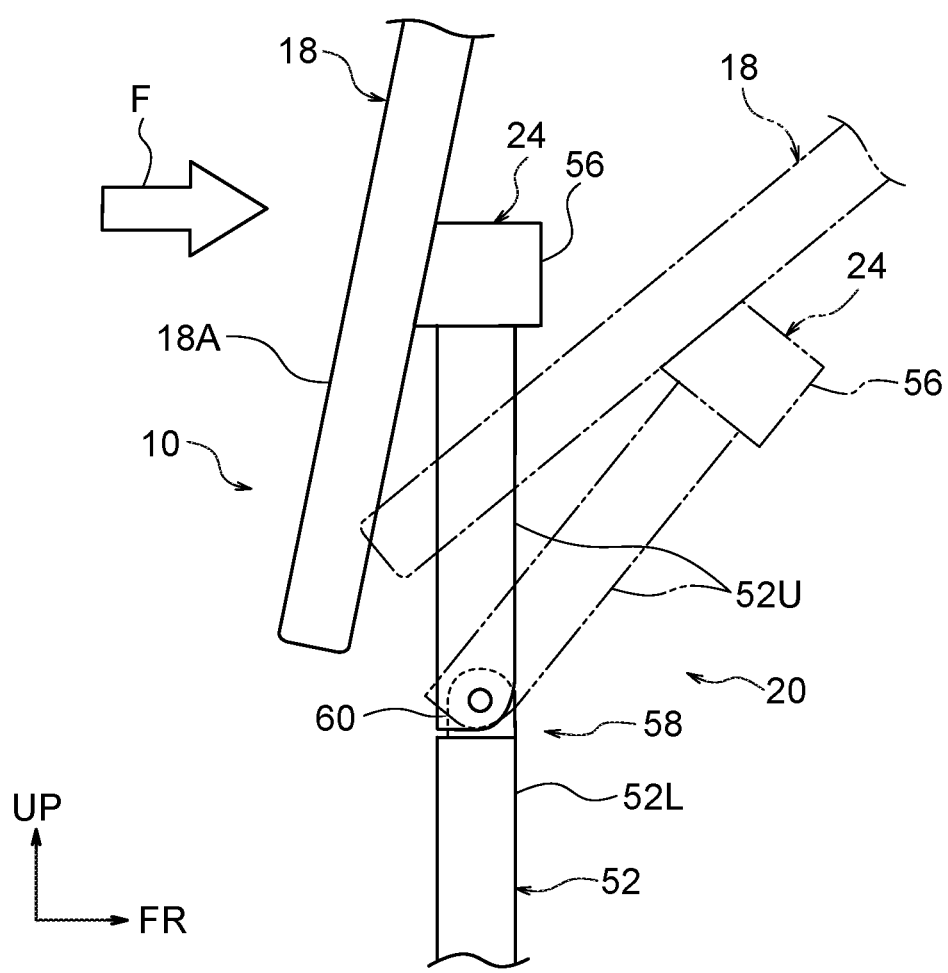
FIG. 5 is a side view of part of the display and moving device as seen from the vehicle right side.
Figure 6:
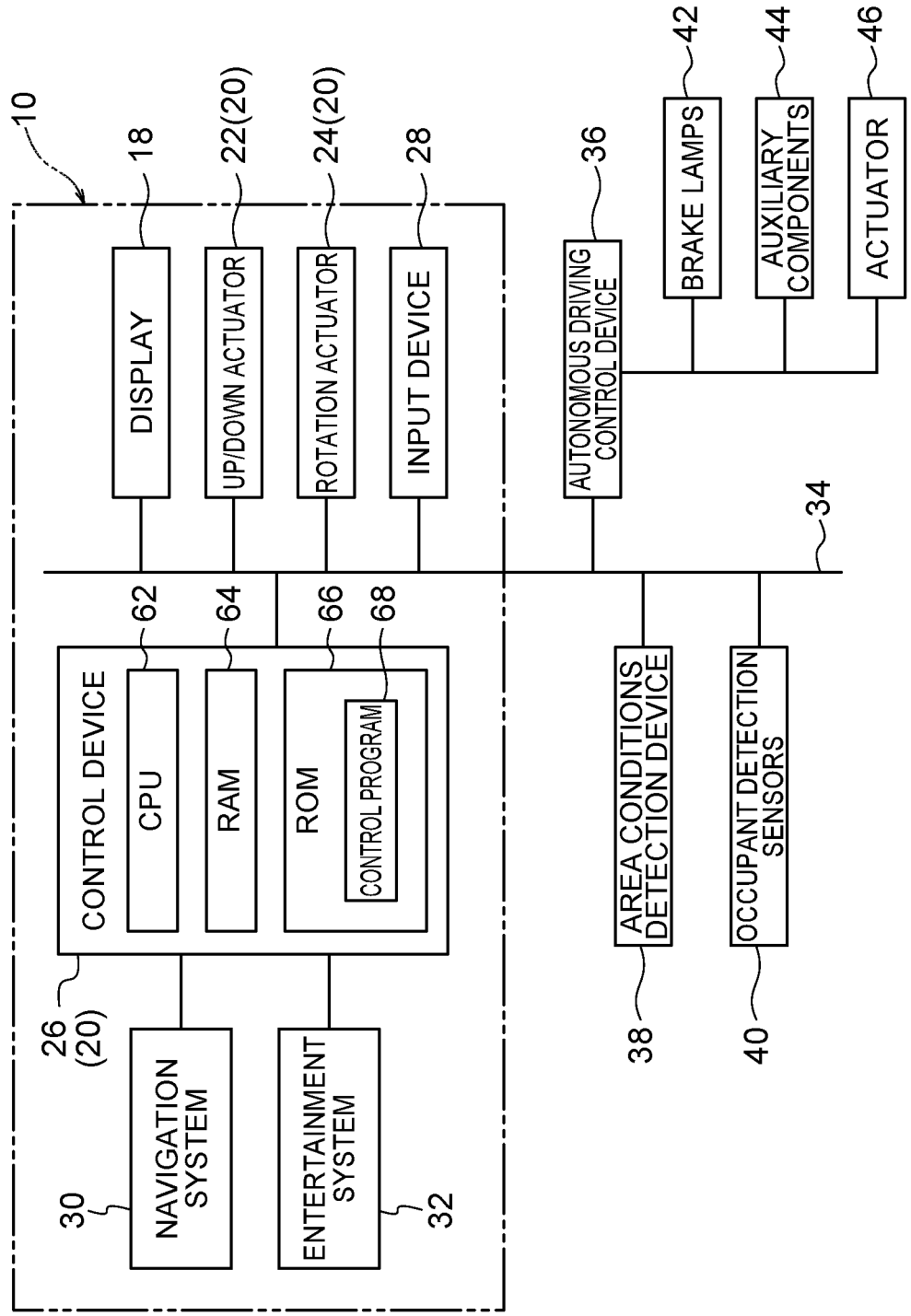
FIG. 6 is a block diagram showing the general configuration of the vehicle display device pertaining to the first embodiment.

As shown in FIG. 1 to FIG. 6, the vehicle display device 10 is equipped with a display 18 and a moving device 20. As shown in FIG. 4 to FIG. 6, the moving device 20 is configured to include an up/down actuator 22 and a rotation actuator 24. Furthermore, as shown in FIG. 6, the vehicle display device 10 is equipped with a control device 26, an input device 28, and a navigation system 30 and an entertainment system 32 (both of which are application systems).

The control device 26 is connected via an on-board network 34 such as a controller area network (CAN) to the display 18, the up/down actuator 22, the rotation actuator 24, and the input device 28. An autonomous driving control device 36, an area conditions detection device 38, and occupant detection sensors 40 that are installed in the vehicle 12 are connected to the on-board network 34. Furthermore, brake lamps 42, auxiliary components (e.g., turn signal lamps, headlamps, wiper devices, etc.) 44, and an actuator 46 are connected to the autonomous driving control device 36. The configuration for autonomous driving control of the vehicle 12 will be described first, and then the configuration of the vehicle display device 10, which is the important portion of the present embodiment, will be described.

(Autonomous Driving Control)

The autonomous driving control device 36 is configured by a microcomputer including a central processing unit (CPU), a random-access memory (RAM), and a read-only memory (ROM). The autonomous driving control device 36 controls the autonomous driving of the vehicle 12 by decompressing, in the RAM, and executing, with the CPU, a program prestored in the ROM and controlling the activation of the brake lamps 42, the auxiliary components 44, and the actuator 46. It will be noted that the autonomous driving control device 36 may also be configured from plural electronic control units.

Figure 8:
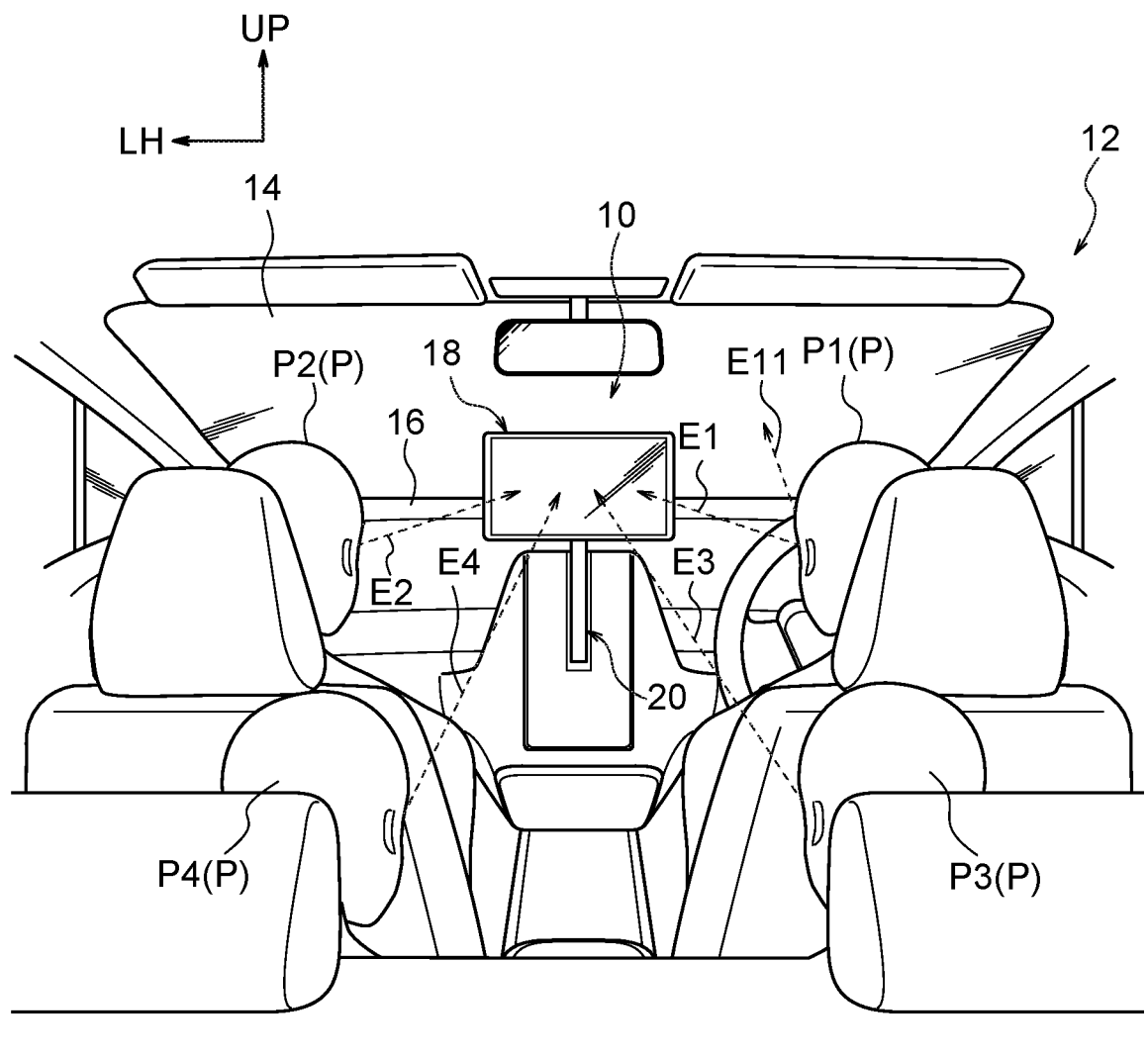
FIG. 8 is a perspective view showing a condition in which the display has been moved to the upper position to make it easier for occupants to view the display.

The autonomous driving control device 36 specifically controls switching between autonomous driving, in which it performs control of the vehicle 12 by judging the area information of the vehicle 12 and the conditions of the vehicle 12, and manual driving by an occupant P1 sitting in the driver's seat (see FIG. 8; hereinafter, there will be cases where this occupant is called "the driver P1"). It will be noted that in FIG. 8 P2 is an occupant sitting in the front passenger seat and P3 and P4 are occupants sitting in rear seats. Hereinafter, there will be cases where the occupants P1 to P4 are simply called "the occupants P."

When the vehicle 12 is driving autonomously, the autonomous driving control device 36 judges the vehicle 12 and the area information thereof on the basis of information obtained from the area conditions detection device 38, which comprises various types of sensors and cameras, in order to allow the vehicle 12 to travel autonomously. Additionally, in accordance with the judgment results, the autonomous driving control device 36 performs an autonomous driving control process that controls the actuator 46, which drives how much the accelerator pedal is depressed, how much the brake pedal is depressed, and the steering angle. The autonomous driving control process generates a travel plan following a preset target route on the basis of the area information of the vehicle 12 and map information and controls driving so that the vehicle 12 travels autonomously in accordance with the generated travel plan.

Furthermore, the autonomous driving control device 36 can store information about travel operation states of the vehicle 12 and output the information about travel operation states of the vehicle 12 that has been stored. The information about travel operation states of the vehicle 12 includes information about a manual driving state in which the vehicle 12 is being manually driven by the occupant P1 (manual driving state information), information about an autonomous driving state in which the vehicle 12 is being allowed to travel automatically by the autonomous driving control device 36 (autonomous driving state information), and information about a non-driving state in which there is an occupant P inside the cabin of the vehicle 12 that is not being manually driven or driving autonomously (non-driving state information). The autonomous driving control device 36 judges the non-driving state using information obtained from the occupant detection sensors 40. The occupant detection sensors 40 comprise various types of sensors and camera provided inside the cabin, for example, and detect the occupants P inside the cabin.

Furthermore, the autonomous driving control device 36 outputs predetermined information relating to assisting the driving of the vehicle 12. Examples of the predetermined information include information indicating the start of the autonomous driving control process and information indicating the end of the autonomous driving control process.

For example, during manual driving by the occupant P1, the autonomous driving control device 36 can automatically start the autonomous driving control process in accordance with the behavior of the vehicle 12 and the area conditions and assist the driving of the vehicle 12 by the occupant P1. In this case, the autonomous driving control device 36 outputs the information indicating the start of the autonomous driving control process. Furthermore, in a case where there is an instruction from the occupant P1 to switch from manual driving by the occupant P1 to autonomous driving by the autonomous driving control process, the autonomous driving control device 36 outputs information indicating that a handover of driving responsibilities will take place, namely, the predetermined information that is the information indicating the start of the autonomous driving control process.

Furthermore, during the execution of the autonomous driving control process, the autonomous driving control device 36 can automatically end (cancel) the autonomous driving control process in accordance with the behavior of the vehicle 12 and the area conditions and perform a process that prompts the occupant P1 to manually drive the vehicle 12. In this case, the autonomous driving control device 36 outputs the information indicating the end of the autonomous driving control process in order to prompt the occupant P1 to manually drive the vehicle 12. Furthermore, in a case where there is an instruction from the occupant P1 to switch from autonomous driving by the autonomous driving control process to manual driving by the occupant P1, the autonomous driving control device 36 outputs information indicating that a handover of driving responsibilities will take place, namely, the predetermined information that is the information indicating the end of the autonomous driving control process.

It will be noted that the autonomous driving control device 36 can be equipped with a communication device that exchanges information between the vehicle 12 and the outside of the vehicle 12 to receive area information. Examples of the communication device include a communication device that receives information about road conditions by road-to-car communication, such as a dedicated short-range communication (DSRC) wireless communication device. Furthermore, examples of area information about road conditions received by road-to-car communication include information about the shape and state of lanes and roads, such as road cants, the positional relation of the vehicle 12 to the lane, the positional relation of other vehicles 12 currently traveling, and the amount of traffic in the area. Furthermore, the autonomous driving control device 36 can utilize the navigation system 30 as an example of a device for obtaining the area information.

The area conditions detection device 38 has plural types of sensors and cameras and detects area information of the vehicle 12 in order for autonomous driving by the autonomous driving control device 36 to be performed. For example, the area conditions detection device 38 detects, as area information of the vehicle 12, information acquired by camera imaging, obstacle information acquired by radar, and obstacle information acquired by LIDAR (laser imaging, detection and ranging). The area information includes, for example, the positions of the white lines of the traveling lane with respect to the vehicle 12, the position of the center of the lane, road width, road shape, and the conditions of obstacles in the area of the vehicle 12. It will be noted that "road shape" includes, for example, the radius of curvature of the traveling lane, changes in the grade of the road valid for estimation by the sensors, and undulations. Furthermore, the "conditions of obstacles in the area of the vehicle 12" include, for example, information distinguishing between stationary obstacles and moving obstacles, the positions of obstacles with respect to the vehicle 12, the moving directions of obstacles with respect to the vehicle 12, and the relative speeds of obstacles with respect to the vehicle 12.

(Vehicle Display Device)

Next, the configuration of the vehicle display device 10, which is the important portion of the present embodiment, will be described. As mentioned above, the vehicle display device 10 is equipped with the display 18, the moving device 20, the control device 26, the input device 28, the navigation system 30, and the entertainment system 32 (see FIG. 1 to FIG. 6). The control device 26 configures a control unit (a part) of the moving device 20. Each of these constituent elements will be described in detail below.

The display 18 is a liquid crystal display or an organic EL display, for example, and is formed in the shape of a long rectangular panel. Substantially all of one side surface in the panel thickness direction (thickness direction) of the display 18 is a display surface 18A, and the display 18 is disposed in a state in which the display surface 18A faces the vehicle rearward direction. The display surface 18A configures, for example, a capacitance touch sensor. Furthermore, the display 18 has, for example, a built-in acceleration sensor, the inclination of the display 18 is detected on the basis of the force of gravity detected by the acceleration sensor, and the orientation of the screen displayed on the display surface 18A is configured to switch between a vertical orientation and a horizontal orientation. Specifically, in a state in which the longitudinal direction of the display 18 is oriented along the vehicle vertical direction, a vertically long screen is displayed on the display surface 18A, and in a state in which the longitudinal direction of the display 18 is oriented along the vehicle width direction, a horizontally long screen is displayed on the display surface 18A.

As shown in FIG. 4 to FIG. 6, the moving device 20 is equipped with a slide guide 50, a slide member 52, the up/down actuator 22, and the rotation actuator 24. The slide guide 50 is made of metal and formed in the shape of a long square tube, for example, and is provided in the vehicle width direction central portion of the inside of the instrument panel 16 in a posture in which its longitudinal direction is oriented along the vehicle vertical direction. The slide guide 50 is secured to a frame member (e.g., an instrument panel reinforcement) of the vehicle body via a bracket (not shown in the drawings), for example.

The slide member 52 is made of metal and formed in the shape of a long square tube, for example, and is inserted inside the slide member 50 in a posture in which its longitudinal direction is oriented along the vehicle vertical direction. Because of this, the slide member 52 is supported in such a way as to be slidable in the vehicle vertical direction with respect to the slide guide 50. The slide member 52 is formed sufficiently longer than the slide guide 50. A vertically long opening 17 (see FIG. 2 and FIG. 3) is formed in the vehicle width direction central portion of the instrument panel 16 in correspondence to the slide member 52, and when the slide member 52 is slid in the vehicle upward direction with respect to the slide guide 50, the slide member 52 is inserted through the opening 17.

The up/down actuator 22 is a motor equipped with a reducer, for example, and is secured to the slide guide 50 in a posture in which the axial direction of an output shaft (not shown in the drawings) is oriented along the vehicle front and rear direction. A pinion (not shown in the drawings) is secured to the output shaft of the up/down actuator 22. The pinion is meshed with a rack (not shown in the drawings) formed in the side surface of the slide member 52. Because of this, when the up/down actuator 22 forwardly and reversely rotates, the slide member 52 is moved (slid) up and down with respect to the slide guide 50.

The rotation actuator 24 is disposed on the vehicle front side of the display 18. The rotation actuator 24 is equipped with an actuator body 54 (not shown in FIG. 5), which is a motor equipped with a reducer for example, and a cover 56, which comprises resin or the like covering the actuator body 54. The actuator body 54 is secured to the upper end portion of the slide member 52 via a bracket (not shown in the drawings). The actuator body 54 is equipped with an output shaft (not shown in the drawings) that projects in the vehicle rearward direction. The output shaft is secured to the central portion of the display 18 when seen from the vehicle front and rear direction. Because of this, when the actuator body 54 forwardly and reversely rotates, the display 18 is rotated about the axis of the output shaft. It will be noted that in the present embodiment the axial direction of the output shaft of the actuator body 54 is slightly inclined with respect to the vehicle front and rear direction in such a way that the output shaft heads in the vehicle upward direction as it heads in the vehicle rearward direction.

Sensors (not shown in the drawings) for detecting the up/down position and the rotational position of the display 18 are provided in the up/down actuator 22 and the rotation actuator 24. The actuators 22 and 24 are configured in such a way that their activation is controlled by the control device 26, which will be described in detail later. The control device 26 moves the display 18 between a lower position shown in FIG. 1 and an upper rotated position shown in FIG. 3 by activating the up/down actuator 22 and the rotation actuator 24. Namely, the control device 26 controls the activation of the actuators 22 and 24 in such a way that, in the lower position, the longitudinal direction of the display 18 is oriented along the vehicle vertical direction and, in the upper position, the longitudinal direction of the display 18 is oriented along the vehicle width direction. It will be noted that the position of the display 18 shown in FIG. 2 (an upper non-rotated position) and the upper rotated position shown in FIG. 3 both correspond to the "upper position" of the disclosure. The lower position is set in the vehicle width direction central portion of the instrument panel 16, and the upper position is set on the vehicle upper side of the lower position.

Furthermore, the control device 26 ordinarily disposes the display 18 in the lower position. In a state in which the display 18 is positioned in the lower position, the display 18 fits inside a recessed portion 19 formed in the vehicle width direction central portion of the instrument panel 16, and the display surface 18A of the display 18 and the surface of the instrument panel 16 are disposed in substantially the same plane.

Moreover, in the moving device 20 pertaining to the present embodiment, a hinge mechanism (a center-bending mechanism) 58 serving as a forward movement allowance mechanism is provided in the vertical direction middle portion of the slide member 52. At the hinge mechanism 58, the slide member 52 is divided into an upper portion 52U and a lower portion 52L, and the upper portion 52U and the lower portion 52L are rotatably coupled to each other by a hinge shaft 60. The hinge shaft 60 is disposed in a posture in which its axial direction lies along the vehicle width direction, and the upper portion 52U of the slide member 52, the rotation actuator 24, and the display 18 are rotatable about the hinge shaft 60 between an upright position indicated by the solid lines in FIG. 5 and a forwardly tilted position indicated by the long-dashed double-short-dashed lines in FIG. 5. Furthermore, the hinge mechanism 58 is equipped with an elastic member (e.g., a torsion coil spring; not shown in the drawings) that bridges the upper portion 52U and the lower portion 52L. The elastic member biases the upper portion 52U to the upright position. Because of this, the rotation actuator 24 and the upper portion 52U are ordinarily held in the upright position.

In the moving device 20, when a load F (see FIG. 5) equal to or greater than a preset value acts from the vehicle rear side on the display 18 positioned in the upper position, the elastic member becomes elastically deformed. Because of this, forward movement (movement to the forwardly tilted position indicated by the long-dashed double-short-dashed lines in FIG. 5) of the display 18 with respect to the instrument panel 16 is allowed.

As shown in FIG. 6, the control device 26 is configured by a microcomputer including a CPU 62, a RAM 64, and a ROM 66. The ROM 66 stores a control program 68 for controlling the operation of the vehicle display device 10. In the control device 26, the control program 68 is read from the ROM 66 and extracted to the RAM 64, and the control program 68 extracted to the RAM 64 is executed by the CPU 62. It will be noted that the control device 26 may also be configured from plural electronic control units.

The input device 28 is equipped with a touch panel, which is provided on the display surface 18A of the display 18, and an up switch 70U and a down switch 70L (see FIG. 1 to FIG. 3), which are provided on the instrument panel 16. The up switch 70U and the down switch 70L are disposed adjacent to the recessed portion 19. It will be noted that although in the present embodiment the up switch 70U and the down switch 70L are push-button switches, for example, the switch type can be appropriately changed. Furthermore, the switches may also be touch keys (soft keys) displayed on the display surface 18A. Hereinafter, there will be cases where the up switch 70U and the down switch 70L are called "the input unit 70."

The control device 26 controls the operation of the navigation system 30, the entertainment system 32, the up/down actuator 22, and the rotation actuator 24 in response to operations performed by the occupants P and received via the input device 28. In a state in which the navigation system 30 is set as the foreground application system, a screen of a map showing the current position of the vehicle 12 and the route to the destination is displayed on the display surface 18A of the display 18. Furthermore, in a state in which the entertainment system 32 is set as the foreground application system, a screen of a TV program, a movie, a video clip, or the Internet is displayed on the display 18.

Furthermore, the control device 26 moves the display 18 between the lower position and the upper rotated position when the up switch 70U and the down switch 70L are operated. Specifically, when the up switch 70U is operated in a state in which the display 18 is positioned in the lower position shown in FIG. 1, the control device 26 first activates the up/down actuator 22 to raise the display 18 as is in the vertically long orientation to the upper non-rotated position (see FIG. 2). Next, the control device 26 activates the rotation actuator 24 to rotate the display 18 to the upper rotated position (see FIG. 3). When the down switch 70L is operated in a state in which the display 18 is positioned in the upper rotated position shown in FIG. 3, the control device 26 first activates the rotation actuator 24 to rotate the display 18 to the upper non-rotated position (see FIG. 2). Next, the control device 26 activates the up/down actuator 22 to lower the display 18 to the lower position (see FIG. 1).

Furthermore, when the vehicle 12 is being manually driven, the control device 26 disposes the display 18 in the lower position, and when the vehicle 12 is driving autonomously and when the vehicle 12 is not being driven, the control device 26 allows the movement of the display 18 between the lower position and the upper position (the upper rotated position). Specifically, when the vehicle 12 is being manually driven, the control device 26 disables operation of the input unit 70 (the up switch 70U and the down switch 70L), and when the vehicle 12 is driving autonomously and when the vehicle 12 is not being driven, the control device 26 enables operation of the input unit 70.

Figure 7:
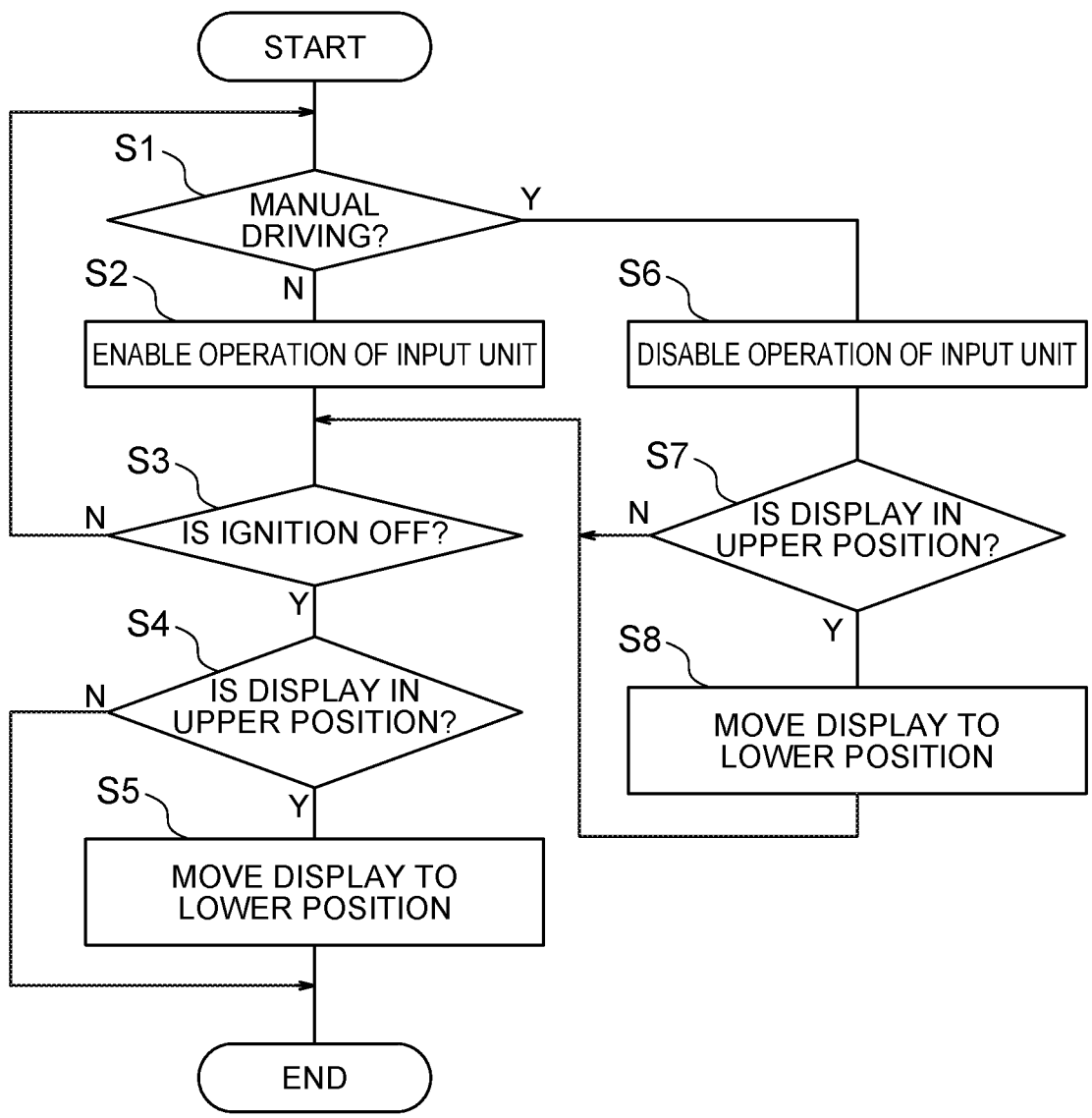
FIG. 7 is a flowchart showing the flow of a process executed by a control device of the vehicle display device pertaining to the first embodiment.

Next, a specific process executed by the control device 26 configured as described above will be described. In FIG. 7, an example of a flow of the process executed by the control device 26 is shown by way of a flowchart. The process is started when, for example, an ignition switch (not shown in the drawings) provided in the vehicle 12 is switched on. When the process is started, first, in step S1, the control device 26 judges, on the basis of information output from the autonomous driving control device 36 (the manual driving state information, the autonomous driving state information, or the non-driving state information), whether or not the vehicle 12 is being manually driven. In a case where the judgment is YES, the control device 26 moves to step S6, and in a case where the judgment is NO, the control device 26 moves to step S2.

In a case where the control device 26 has moved to step S2, that is, in a case where it has been judged that the vehicle 12 is driving autonomously or is not being driven, the control device 26 enables operation of the input unit 70. This makes it possible for the display 18 to be moved between the lower position and the upper position (the upper rotated position). When the process in step S2 is completed, the control device 26 moves to step S3.

In step S3, the control device 26 judges whether or not the ignition switch has been switched off. In a case where the judgment is NO, the control device 26 returns to step S1, and in a case where the judgement is YES, the control device 26 moves to step S4.

In step S4, the control device 26 judges, on the basis of output from the sensors provided in the up/down actuator 22 and the rotation actuator 24, whether or not the display 18 is positioned in the upper position (the upper rotated position). In a case where the judgment is NO, the process shown in FIG. 7 is ended, and in a case where the judgment is YES, the control device 26 moves to step S5.

In a case where the control device 26 has moved to step S5, that is, in a case where it has been judged that the display 18 is positioned in the upper position (the upper rotated position), the control device 26 activates the up/down actuator 22 and the rotation actuator 24 to move the display 18 to the lower position. When the process in step S5 is completed, the process shown in FIG. 7 is ended.

In a case where it has been judged in step S1 that the vehicle 12 is being manually driven and the control device 26 has moved to step S6, in step S6 the control device 26 disables operation of the input unit 70. This makes it impossible for the display 18 to be moved between the lower position and the upper position. When the process in step S6 is completed, the control device 26 moves to step S7.

In step S7, as in step S4, the control device 26 judges whether or not the display 18 is positioned in the upper position (the upper rotated position). In a case where the judgment is NO, the control device 26 moves to step S3, and in a case where the judgment is YES, the control device 26 moves to step S8.

In step S8, as in step S5, the control device 26 activates the up/down actuator 22 and the rotation actuator 24 to move the display 18 to the lower position. Because of this, the display 18 is moved to the lower position even in a case where the display 18 is positioned in the upper position (the upper rotated position) when the vehicle 12 has been switched from autonomous driving to manual driving. As a result, the field of view of the driver P1 manually driving the vehicle 12 is prevented from being reduced by the display 18. When the process in step S8 is completed, the control device 26 moves to step S3.

(Action and Effects)

Next, the action and effects of the present embodiment will be described.

In the vehicle display device 10 having the above configuration, the moving device 20 moves the long display 18 between the lower position set in the vehicle width direction central portion of the instrument panel 16 of the vehicle 12 and the upper position set on the vehicle upper side of the lower position. Furthermore, in the lower position the moving device 20 orients the longitudinal direction of the display 18 along the vehicle vertical direction, and in the upper position the moving device 20 orients the longitudinal direction of the display 18 along the vehicle width direction.

In this way, in the lower position the longitudinal direction of the display 18 is oriented along the vehicle vertical direction, so even in a case where the display 18 is large, it becomes easier to ensure placement space for the display 18 in the vehicle width direction central portion of the instrument panel 16. Furthermore, in the upper position the longitudinal direction of the display 18 is oriented along the vehicle width direction, so the horizontally long screen of a TV program or the Internet, for example, can be displayed large on the display 18. Moreover, the display 18 is moved in the vehicle upward direction at the vehicle width direction central portion of the vehicle 12, so as shown in FIG. 8, it becomes easier not only for the driver P1 but also the occupants P2 to P4 in the front passenger seat and the rear seats to view the display 18 (see arrows E1 to E4 in FIG. 8).

Furthermore, in the present embodiment, the moving device 20 disposes the display 18 in the lower position when the vehicle 12 is being manually driven. Because of this, the field of view of the driver P1 can be prevented from being reduced by the display 18. Furthermore, when the vehicle 12 is driving autonomously and when the vehicle 12 is not being driven (e.g., when there is an occupant P inside the cabin of the vehicle 12 when the vehicle 12 is parked), the moving device 20 allows the movement of the display 18 between the lower position and the upper position. Because of this, the occupants P including the driver P1 can arbitrarily move the display 18 to the upper position using the moving device 20.

Moreover, the display 18 is moved upward diagonally in front of the driver P1 rather than in front of the driver P1, so the forward field of view of the driver P1 is not obstructed by the display 18. Because of this, even when the vehicle 12 is driving autonomously, it becomes possible for the driver P1 to pay attention to the vehicle forward direction. Moreover, the height of the line of sight when the driver P1 looks in the vehicle forward direction and the height of the line of sight when the driver P1 views the display 18 are equal or substantially equal to each other, so when the driver P1 is enjoying a TV program or the like on the display 18 when the vehicle 12 is driving autonomously, there is less movement in the line of sight when the driver P1 pays attention to the vehicle forward direction (see arrow E1 and arrow E11 in FIG. 8).

Furthermore, in the present embodiment, in a case where a load equal to or greater than the set value has acted from the vehicle rear side on the display 18 positioned in the upper position, the hinge mechanism 58 that the moving device 20 has allows relative movement of the display 18 in the vehicle forward direction with respect to the instrument panel 16. Because of this, even if an occupant P should hit the display 18 positioned in the upper position, the load that the occupant P receives is lessened.

Next, another embodiment of the disclosure will be described. It will be noted regarding configurations and actions that are basically the same as those in the first embodiment that the same reference signs as in the first embodiment will be assigned thereto and description thereof will be omitted.

Second Embodiment

Figure 9:
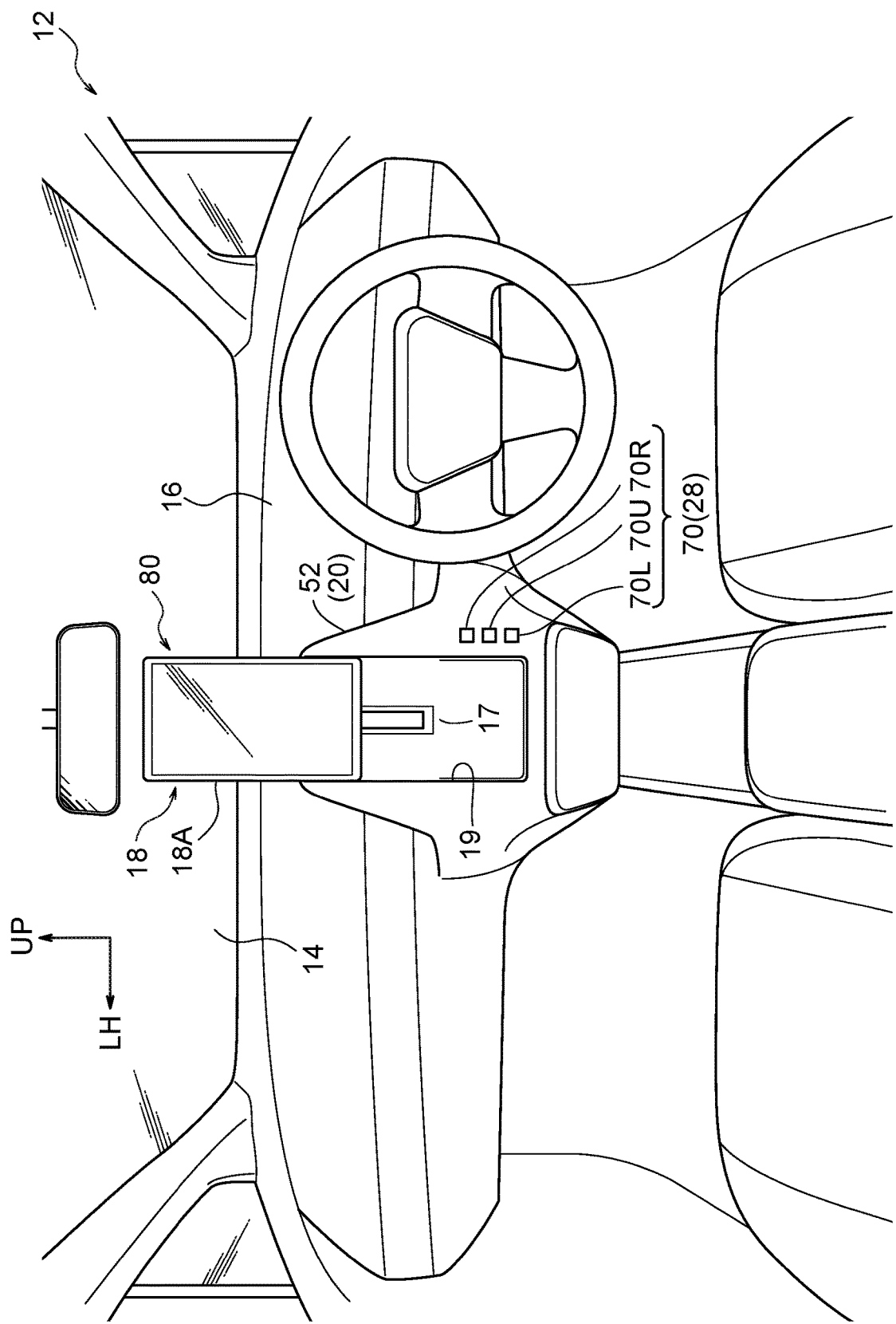
FIG. 9 is a perspective view showing the front portion of the cabin of the vehicle in which a vehicle display device pertaining to a second embodiment of the disclosure is installed, and shows a state in which the display is positioned in the upper position with its longitudinal direction oriented along the vehicle vertical direction.

In FIG. 9, the front portion of the cabin of the vehicle 12 in which a vehicle display device 80 pertaining to a second embodiment of the disclosure is installed is shown by way of a perspective view. This embodiment has basically the same configuration as the first embodiment, but the configuration of the moving device 20 is slightly different. The moving device 20 pertaining to this embodiment is configured in such a way that, in a state in which the display 18 is positioned in the upper position, the longitudinal direction of the display 18 is selectively switchable to a state in which it is oriented along the vehicle vertical direction or a state in which it is oriented along the vehicle width direction.

Specifically, the input device 28 of the vehicle display device 80 is equipped with a rotation switch 70R in addition to the up switch 70U and the down switch 70L. The rotation switch 70R is provided in the instrument panel 16 adjacent to the up switch 70U and the down switch 70L. The rotation switch 70R is a switch for activating the rotation actuator 24, and operation of the rotation switch 70R is enabled only in a state in which the display 18 is positioned in the upper position. It will be noted that the rotation switch 70R may also be a touch key (soft key) displayed on the display surface 18A of the display 18.

When the up switch 70U is operated in a state in which the display 18 is positioned in the lower position (FIG. 1), the control device 26 activates the up/down actuator 22 to move the display 18 as is in the vertically long posture to the upper non-rotated position (see FIG. 9). When the rotation switch 70R is operated thereafter, the control device 26 activates the rotation actuator 24 to rotate the display 18 to the horizontally long posture (see FIG. 3). When the rotation switch 70R is operated once more, the control device 26 rotates the display 18 to the vertically long posture (see FIG. 9). Namely, each time the rotation switch 70R is operated, the control device 26 rotates the display 18 alternately to the vertically long posture and the horizontally long posture.

Furthermore, in a case where the down switch 70L has been operated in a state in which the display 18 is positioned in the upper position, the control device 26 judges whether the display 18 is positioned in the upper non-rotated position (see FIG. 9) or the upper rotated position (see FIG. 3). In a case where it has been judged that the display 18 is positioned in the upper non-rotated position, the control device 26 activates the up/down actuator 22 to move the display 18 as is in the vertically long posture to the lower position. In a case where it has been judged that the display 18 is positioned in the upper rotated position, the control device 26 first activates the rotation actuator 24 to rotate the display 18 to the vertically long posture and thereafter activates the up/down actuator 22 to move the display 18 to the lower position. In this embodiment, configurations other than those described above are the same as in the first embodiment.

In this embodiment also, in the lower position the longitudinal direction of the display 18 is oriented along the vehicle vertical direction, so even in a case where the display 18 is large, it becomes easier to ensure placement space for the display 18 in the vehicle width direction central portion of the instrument panel 16. Furthermore, in the upper position the longitudinal direction of the display 18 is selectively switchable to a state in which it is oriented along the vehicle vertical direction or a state in which it is oriented along the vehicle width direction. For this reason, for example, when an occupant of the vehicle 12 wants to display on the display 18 the horizontally long screen of a TV program or the Internet, the horizontally long screen can be displayed large on the display 18 by switching the display 18 to the state in which the longitudinal direction of the display 18 is oriented along the vehicle width direction. Moreover, the display 18 is moved in the vehicle upward direction at the vehicle width direction central portion of the display 18, so it becomes easier not only for the driver P1 but also the occupants P2 to P4 in the front passenger seat and the rear seats to view the display 18.

The disclosure has been described above by way of a few embodiments, but the disclosure can be changed and implemented in a variety of ways in a range that does not depart from the spirit thereof. For example, the moving device 20 pertaining to each of the embodiments is merely an example, and the configuration of the moving mechanism can be appropriately changed using existing actuators or the like.

Furthermore, the moving device 20 pertaining to each of the embodiments is configured to dispose the display 18 in the lower position (configured to regulate the movement of the display 18 to the upper position) when the vehicle 12 is being manually driven, but the moving device 20 is not limited to this. For example, the moving device 20 may also be configured in such a way that upward movement of the display 18 is allowed in a particular (preset) range when the vehicle 12 is being manually driven.

Furthermore, in each of the embodiments, the vehicle display device is equipped with the hinge mechanism 58 serving as the forward movement allowance mechanism, but the forward movement allowance mechanism is not limited to this, and the configuration of the forward movement allowance mechanism can be appropriately changed. For example, the forward movement allowance mechanism may also be configured in such a way that the display 18 drops out in the vehicle forward direction in a case where a load equal to or greater than the preset value has acted from the vehicle rear side on the display 18 positioned in the upper position. Furthermore, the vehicle display device may also have a configuration where the forward movement allowance mechanism is omitted.

Furthermore, in each of the embodiments, a case was described where the process performed by the control device 26 is a software process performed by executing a program, but the process is not limited to this and may also be a process performed by hardware. Alternatively, the process may also be a process that combines both software and hardware. Furthermore, the program stored in the ROM 68 may also be stored in various types of storage media and distributed.

What is claimed is:

1. A vehicle display device, comprising:
a display formed in an elongate shape; and
a moving device that moves the display between a lower position at a vehicle width direction central portion of an instrument panel of a vehicle, and an upper position at a vehicle upper side of the lower position, the moving device being configured in such a way that, in the lower position, the moving device orients a longitudinal direction of the display along a vehicle vertical direction and, in the upper position, the moving device orients the longitudinal direction of the display along the vehicle width direction.

2. A vehicle display device, comprising:
a display formed in an elongate shape; and
a moving device that moves the display between a lower position at a vehicle width direction central portion of an instrument panel of a vehicle, and an upper position at a vehicle upper side of the lower position, the moving device being configured in such a way that, in the lower position, the moving device orients a longitudinal direction of the display along a vehicle vertical direction and, in the upper position, the longitudinal direction of the display is selectively switchable between a state in which the longitudinal direction is oriented along the vehicle vertical direction and a state in which the longitudinal direction is oriented along the vehicle width direction.

3. The vehicle display device according to claim 1, wherein:
the vehicle is switchable between manual driving and autonomous driving, and
the moving device disposes the display in the lower position when the vehicle is being manually driven and allows movement of the display when the vehicle is driving autonomously and when the vehicle is not being driven.

4. The vehicle display device according to claim 2, wherein:
the vehicle is switchable between manual driving and autonomous driving, and
the moving device disposes the display in the lower position when the vehicle is being manually driven and allows movement of the display when the vehicle is driving autonomously and when the vehicle is not being driven.

5. The vehicle display device according to claim 1, wherein the moving device comprises a forward movement allowance mechanism which, in a case in which a load equal to or greater than a preset value has acted, from a vehicle rear side, on the display positioned in the upper position, allows relative movement of the display in a vehicle forward direction with respect to the instrument panel.

6. The vehicle display device according to claim 2, wherein the moving device comprises a forward movement allowance mechanism which, in a case in which a load equal to or greater than a preset value has acted, from a vehicle rear side, on the display positioned in the upper position, allows relative movement of the display in a vehicle forward direction with respect to the instrument panel.

7. The vehicle display device according to claim 1, wherein the display displays a vertically long screen in a state in which the longitudinal direction is oriented along the vehicle vertical direction and displays a horizontally long screen in a state in which the longitudinal direction is oriented along the vehicle width direction.

8. The vehicle display device according to claim 2, wherein the display displays a vertically long screen in a state in which the longitudinal direction is oriented along the vehicle vertical direction and displays a horizontally long screen in a state in which the longitudinal direction is oriented along the vehicle width direction.

9. The vehicle display device according to claim 1, wherein, in a state in which the display is positioned in the lower position, the display fits inside a recessed portion formed in the vehicle width direction central portion of the instrument panel.

10. The vehicle display device according to claim 2, wherein, in a state in which the display is positioned in the lower position, the display fits inside a recessed portion formed in the vehicle width direction central portion of the instrument panel.

11. The vehicle display device according to claim 5, wherein the forward movement allowance mechanism has an elastic member that becomes elastically deformed when allowing the relative movement of the display.

12. The vehicle display device according to claim 6, wherein the forward movement allowance mechanism has an elastic member that becomes elastically deformed when allowing the relative movement of the display.

13. A vehicle, comprising an instrument panel in which the vehicle display device according to claim 1 is installed.

14. A vehicle, comprising an instrument panel in which the vehicle display device according to claim 2 is installed.

* * * * *

UNITED STATES PATENT AND TRADEMARK OFFICE
CERTIFICATE OF CORRECTION

PATENT NO. : 10,730,448 B2  
APPLICATION NO. : 16/229749  
DATED : August 4, 2020  
INVENTOR(S) : Megumi Amano et al.

Page 1 of 1

It is certified that error appears in the above-identified patent and that said Letters Patent is hereby corrected as shown below:

On the Title Page

Item (72), inventor 1, city, delete "Toyota" and insert --Toyota-shi Aichi-ken--, therefor.

Item (72), inventor 2, city, delete "Nagakute" and insert --Nagakute-shi Aichi-ken--, therefor.

Item (72), inventor 3, city, delete "Toyota" and insert --Toyota-shi Aichi-ken--, therefor.

Item (72), inventor 4, city, delete "Nagoya" and insert --Nagoya-shi Aichi-ken--, therefor.

Item (72), inventor 5, city, delete "Toyota" and insert --Toyota-shi Aichi-ken--, therefor.

Item (72), inventor 6, city, delete "Nagoya" and insert --Nagoya-shi Aichi-ken--, therefor.

In the Specification

In Column 2, Line 30, after "at", delete "a".

Signed and Sealed this  
Eighth Day of December, 2020

Andrei Iancu  
*Director of the United States Patent and Trademark Office*